United States Patent
Liao

(10) Patent No.: US 6,191,041 B1
(45) Date of Patent: Feb. 20, 2001

(54) METHOD OF FABRICATING SEMICONDUCTOR DEVICE

(75) Inventor: Kuan-Yang Liao, Taipei (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/293,437

(22) Filed: Apr. 16, 1999

(30) Foreign Application Priority Data

Mar. 5, 1999 (TW) .................................................. 88103373

(51) Int. Cl.⁷ .................................................. H01L 21/311
(52) U.S. Cl. ........................ 438/694; 438/696; 438/733
(58) Field of Search ............................ 438/585, 691, 438/694, 696, 706, 733

(56) References Cited

U.S. PATENT DOCUMENTS 4,942,137 * 7/1990 Sivan et al. ............................. 437/63
5,381,040 * 1/1995 Sun et al. ............................... 257/774
5,767,017 * 6/1998 Armacost et al. ..................... 438/694
5,970,354 * 10/1999 Hause et al. ........................... 438/305

* cited by examiner

Primary Examiner—Benjamin L. Utech
Assistant Examiner—Kin-Chan Chen
(74) Attorney, Agent, or Firm—Jiawei Huang; J C Patents

(57) ABSTRACT

A method of fabricating semiconductor device. First, a masking layer having an opening pattern is formed on a material layer, and then a mask spacer is formed on the sidewall of the opening. The opening is filled with an insulating layer to cover the material layer exposed by the opening. The masking layer and the mask spacer are removed, allowing the remaining insulating layer to be a mask for defining a pattern of the material layer. Then, the material layer not covered by the insulating layer is removed. The insulating layer is removed again to expose the patterned material layer.

20 Claims, 5 Drawing Sheets

METHOD OF FABRICATING SEMICONDUCTOR DEVICE

CROSS-REFERENCE TO RELATED APPLICATION

This application claims the priority benefit of Taiwan application serial no. 88103373, filed Mar. 5, 1999.

BACKGROUND OF THE INVENTION

1. Field of Invention

The present invention relates to a method of manufacturing an integrated circuit. More particularly, the present invention relates to a method of fabricating a semiconductor device.

2. Description of Related Art

At present, photolithography is a core technique that determines the integrated circuit process integration. Photolithographic steps determine the definition of patterns for all the thin layers relating to the structure of semiconductor devices. Thus, photolithography is a determining key factor in the further of minimization of semiconductor devices.

For example, metal oxide semiconductor (MOS) is widely applicable to the process of very large scale integration (VLSI) circuits at the present. First, the process forms an isolating structure for the devices in the substrate to prevent carriers from passing through the substrate and moving among the adjacent devices. Then an oxide layer and a conducting layer are formed on the substrate, and a layer of photoresist is formed to cover the conducting layer with conventional photolithographic patterning. The pattern on the mask is shifted to a photoresist in exposing and patterning steps. Next, an etching process is performed to define patterns of the oxide layer and the conductive layer with a photoresist serving as an etching mask. This enables the oxide layer and the conducting layer that remain to form a gate oxide layer and a gate layer in the active area defined by the isolating structure. After that, dopants are implanted into in the substrate to form a source/drain region, with the gate layer serving as a mask.

In the above method, the dimension of the gate is determined by the photoresist after exposing and patterning, while 248 nm deep ultra-violet ray is used as the exposing light source for performing a 0.25 μm process in the industry today. If a process is to be performed below 0.18 mm, a stepper is required to enable further minimization of the device, such as an improved KrF 248 nm scanning stepper with improved lens quality, an advanced mask and wafer platform technique, and a high numerical aperture. But the wavelength is physically limited while the mask difficult to manufacture. Moreover, the improvement via a photolithographic system to meet the demand of the photolithographic process of below 0.18 mm also increases the cost of the process.

SUMMARY OF THE INVENTION

The present invention is to provide a method of fabricating a semiconductor device, in which a masking layer which has an opening pattern on a material layer is formed and a mask spacer on a sidewall of the opening is formed. The opening is filled with an insulating layer to cover the material layer exposed by the opening. After that, the mask layer and the mask spacer are removed, so that the insulating layer that remains serves as a mask for defining the material pattern. After the material layer uncovered by the insulating layer is removed, the insulating layer is then removed to expose the patterned material layer.

As embodied and broadly described herein, the method can be applied to the pattern definition of the conducting layer of the gate. The above material layer can be a polysilicon layer, while the masking layer, the mask spacer, and the insulating layer have different etching and polishing ratios from those of the polysilicon layer. The material for the masking layer and the mask spacer includes silicon nitride, while the material for the insulating layer includes silicon oxide. The method is to cover the substrate fully with a silicon oxide layer. Then, the oxide layer covering the surface of the masking layer and the mask spacer is removed, so that the oxide layer that remains covers only the material. exposed by the above opening. The opening of the above masking layer, the size of the opening can be determined according to the current photolithographic process. The deficiency in photolithographic process can compensate for the mask spacer formed on the sidewall of the opening. This allows the reduction of the dimension of material layer after patterning. Therefore, the difficulty of the photolithography process is reduced, and the dimension of the material layer to be defined is reduced. This improves the degree of the device integration.

Another method of fabricating a semiconductor device is provided in the invention, in which a masking layer having opening pattern on the material layer is formed and a mask spacer is formed on the sidewall of the opening. A part of the material layer exposed in the opening is removed, extending the opening to the material layer. The opening is filled with an insulating layer to cover the material layer exposed by the opening. The masking layer and the masking spacer are removed, so the insulating layer that remains serves as a mask for defining the material pattern. The material layer uncovered by the bottom of the insulating layer is removed. Ultimately, the insulating layer is removed to expose the patterned material layer.

As embodied and broadly described herein, the method is applicable to the pattern definition of a conducting layer of the gate. The above material layer can be the polysilicon layer, while the masking layer and the masking spacer have different etching and polishing ratios from those of the polysilicon layer. The material for the masking layer and the mask spacer includes silicon nitride, while the material for the insulating layer includes silicon oxide. Initially, the substrate is covered with an oxide layer in full scale. The oxide layer covering the masking layer and the surface of the mask spacer is removed via chemical mechanical polishing (CMP), so that the remaining oxide layer covers only the top of the material layer exposed by the above opening. The masking layer and the mask spacer are removed by wet etching. The planarization process can be selectively performed with CMP to remove the excessive material layer, leaving only the insulating layer in the opening of the material layer. In the present invention, the size of the opening can be determined according to the current photolithographic process. The deficiency in the photolithographic process can be compensated for by the mask spacer formed on the sidewall of the opening, so that the dimension of material layer is reduced after patterning. Therefore, the difficulty encountered in the photolithographic process is reduced by the method of the invention, and the dimension of the defined material layer is reduced. This improves the degree of the device integration.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
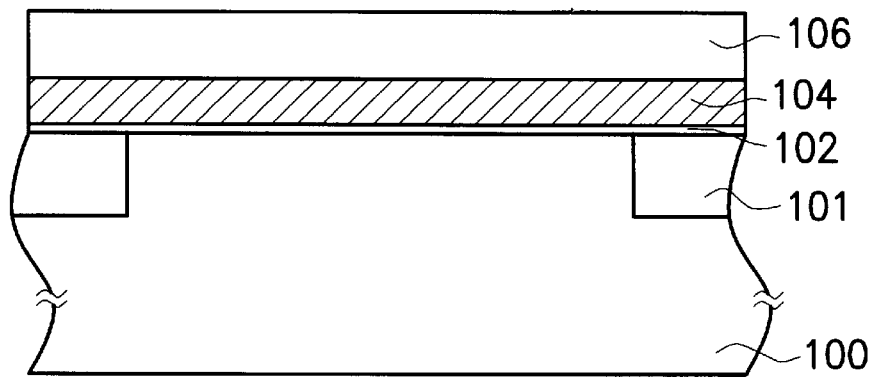
FIGS. 1A, 1B, 1C, 1D, 1E, and 1F are cross-sectional diagrams showing the process flow of a semiconductor device according to a preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A, 1B, 1C, 1D, 1E, and 1F are cross-sectional diagrams showing the process flow of a semiconductor device according to a preferred embodiment of the invention. The method of the invention is applicable to the pattern definition of each material layer (thin layer) of the semiconductor device. While the preferred embodiment is described with reference to the pattern definition of the gate of metal oxide semiconductor (MOS) in 0.18 mm process, the field of application is not limited thereto.

Referring to FIG. 1A, an isolating region 101 is formed on a provided substrate 100. The isolating region 101 is formed by, for example, shallow trench isolation (STI). An oxide layer 102 is formed on the substrate 100 and the oxide layer 102 is formed by, for example, heat oxidation or chemical vapor deposition (CVD) to a thickness of about 30–50 Å. A conducting layer 104 is formed on the oxide layer 102, such as a polysilicon layer formed by CVD to a thickness of about 2500 Å. A masking layer 106 is formed on the conducting layer 104. The masking layer has a different etching rate from that of the conducting layer 104, and is made of, for example, a silicon nitride layer formed by CVD to a thickness of about 500–1500 Å.

Figure 1B:
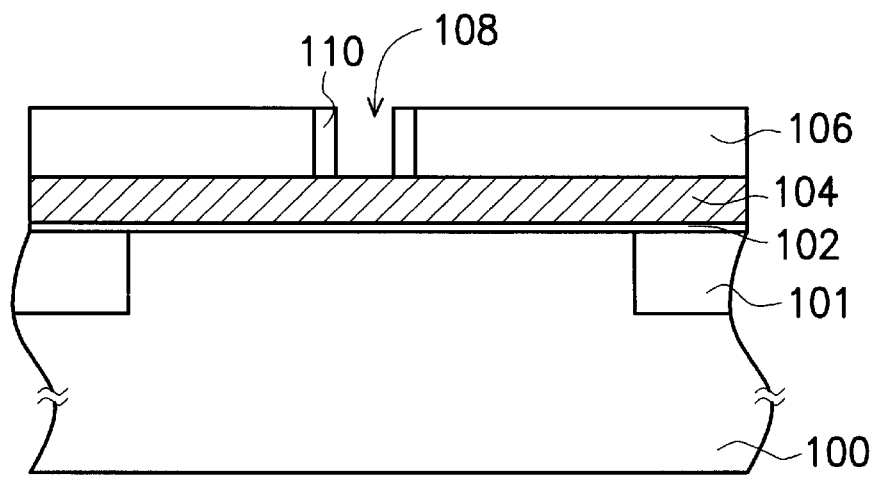

Referring to FIG. 1B, an opening 108 is formed with conventional photolithography and anisotropic etching process in the masking layer 106, to expose a part of the conducting layer 104. A mask spacer 110 is formed in the opening 108. The mask spacer 110 has a different etching ratio from that of the conducting layer and it is preferably made of the same material of masking layer 106, for example, silicon nitride. A blanket type silicon nitride is formed on the substrate 100. Then, by an anisotropically etching back step, silicon nitride that remains on the sidewall of opening 108 can be formed as the above mask spacer 110. Although the method is a limiting photolithographic technique that determines the size of the opening at the present, it can be used to manufacture a gate having a smaller dimension with the current technique. For example, when a gate with a dimension of 0.18 μm has to be manufactured, the opening 108 can be formed with a linewidth of 0.25 μm. With the aid of controlling the thickness of the mask spacer. 110, the width of the gate formed is controlled to 0.18 mm. Thus, the difficulty in the photolithographic technique with a further reduced linewidth can be resolved after the dimension reduction.

Figure 1C:
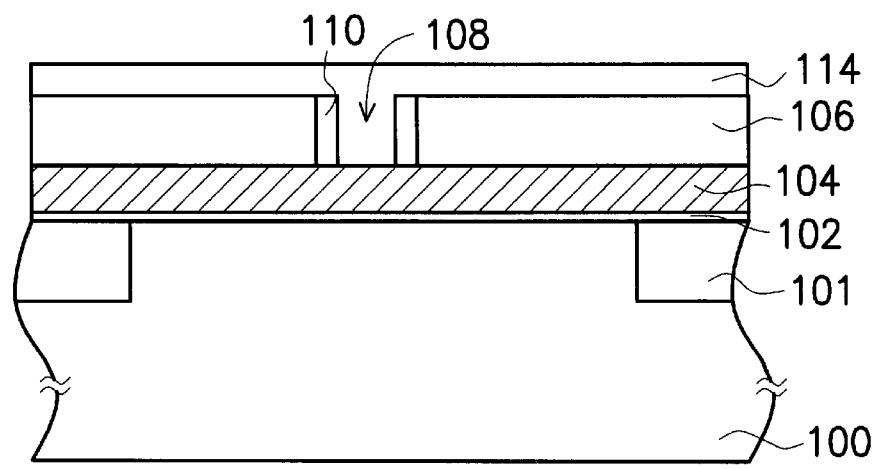

Referring to FIG. 1C, an insulating layer 114 is formed on the substrate 100 to cover the conducting layer 104 exposed by the opening 108, the surface of the masking layer 106 and the mask spacer 110. The material of the insulating layer 114 has different etching and polishing rate from those of the mask spacer 110 and the masking layer 106; the preferred material is silicon oxide deposited by CVD. In the diagram of the present embodiment, the size of the opening 108 is smaller. However, in the practical application, the insulating layer is not required to fill the opening 108, but is only required to cover the conducting layer 104 exposed by the opening 108 completely.

Figure 1D:
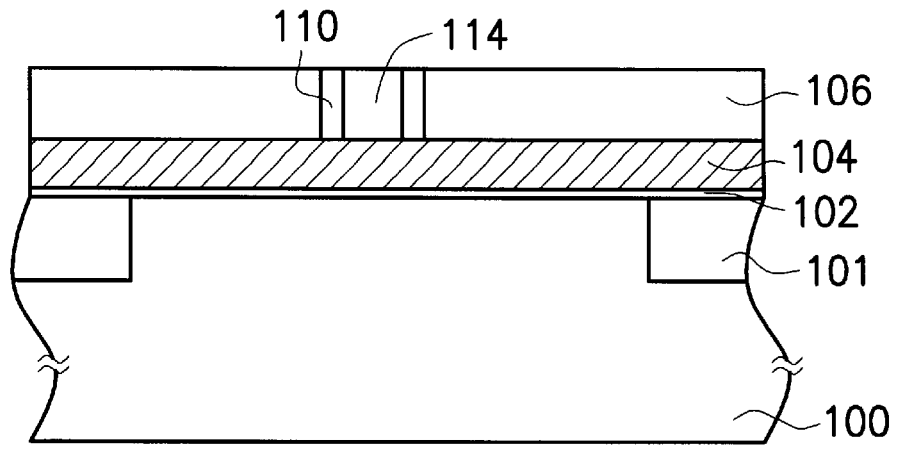

Referring to FIG. 1D, the insulating layer 114 covering the masking layer 106 and the top of the mask spacer 110 are removed. This exposes the masking layer 106 and the surface of the mask spacer 110, and leaves the insulating layer 114 covering the surface of the conducting layer. Preferably, the step is executed with CMP to perform a global planarization process.

Figure 1E:
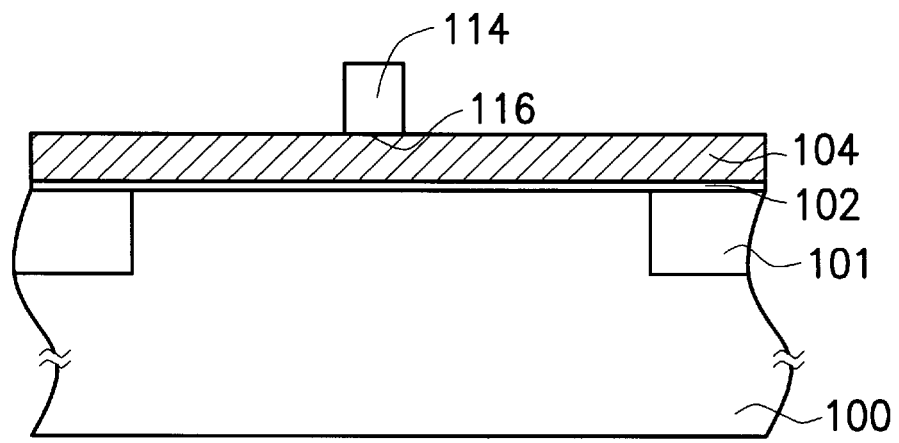

Referring to FIG. 1E, the masking layer 106 and the mask spacer 110 are then removed to expose the surface of the conducting layer 104 and the insulating layer 114. Preferably, the step is performed by selective wet etching process, and, in this case, with hot phosphoric acid treatment.

Figure 1F:
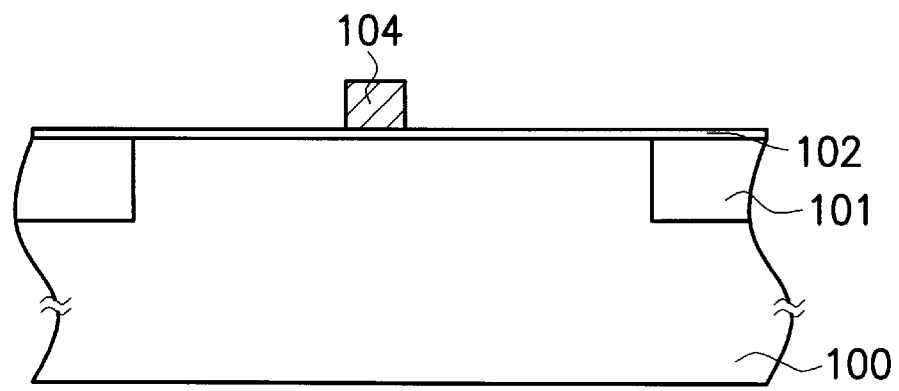

Referring to FIG. 1F, the conducting layer 104, excluding the part of the conducting layer 104 under the bottom 116 of the insulating layer 114 is removed, leaving the patterned conducting layer 104. Preferably, this is performed via an anisotropic dry etching process with the insulating layer 114 serving as an etching mask. The insulating layer 114 is removed by, in this case, wet etching to expose the patterned conducting layer 104.

Referring to FIGS. 1B and 1C, steps of the process can also be adjusted and changed with the above method before the surface of the conducting layer 104 is covered with the insulating layer 114 and after forming the mask spacer 110 in the sidewall of the opening 108. The diagrams of the process are illustrated in the FIGS. 2A to 2D.

Figure 2A:
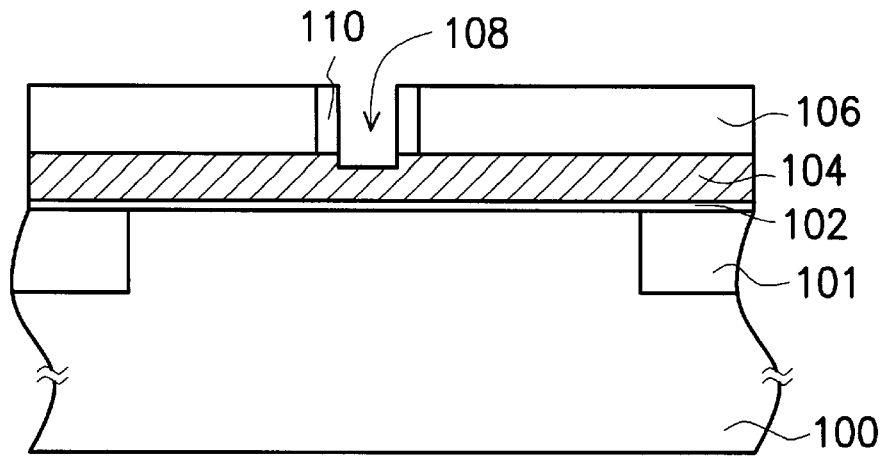
FIGS. 2A, 2B, 2C, 2D, and 2E are cross-sectional diagrams showing the process flow of another semiconductor device according to a preferred embodiment of the invention.

Referring to FIG. 2A, an etching process is performed, with the masking layer 106 and the mask spacer 110 serving as etching masks, to remove a part of the conducting layer 104 exposed by the opening 108. The etching process is performed after the sidewall of the opening 108 has formed the mask spacer 110 shown in the FIG. 1B. This allows the opening 108 to extend to the conducting layer 104. Preferably, the etching process is executed by anisotropic dry etching. The profile of the opening 108, which extends to the conducting layer 104, is formed along the sidewall of the mask spacer. The thickness of the conducting layer 104 that is removed by etching can be adjusted according to practical need.

Figure 2B:
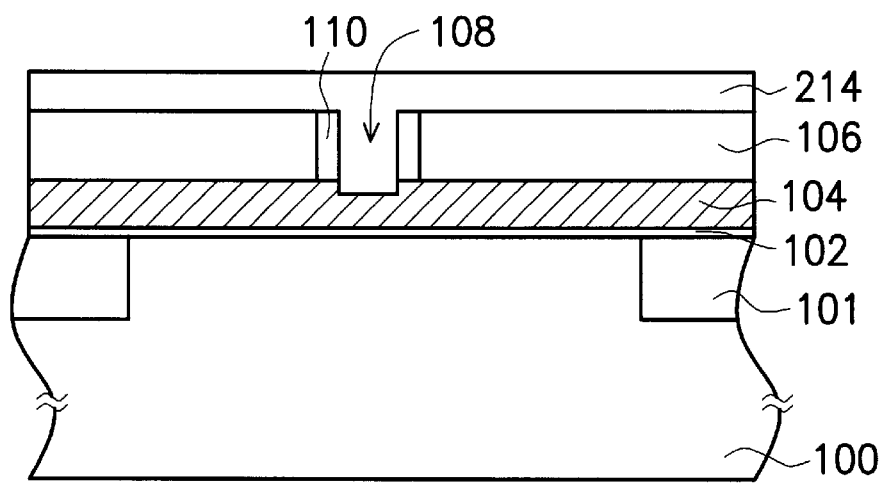

Referring to FIG. 2B, an insulating layer 214 is then formed on the substrate 100 to cover the conducting layer 104, the masking layer 106, and the surface of the mask spacer 110 exposed by the opening 108. The material of the insulating layer 214 has different etching and polishing ratios from those of the mask spacer 110 and the masking layer 106.

Figure 2C:
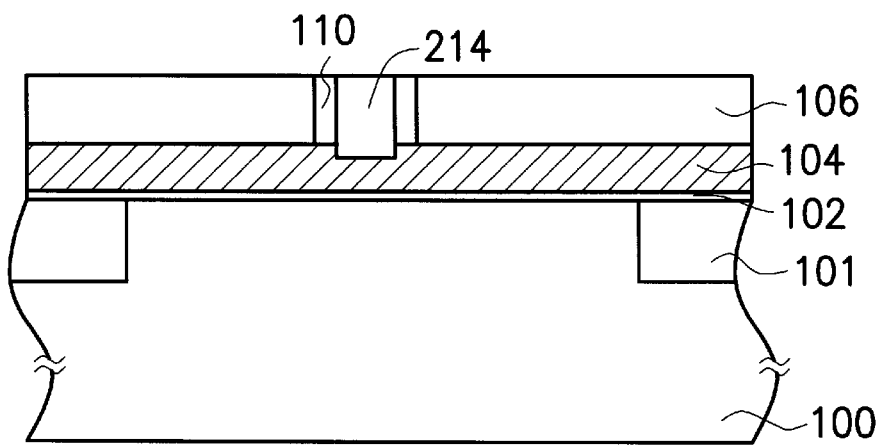

Referring to FIG. 2C, the excessive insulating layer 214 covering the top of the masking layer 106 and the mask spacer 110 is removed. This exposes the masking layer 106 and the surface of the mask spacer 110, leaving the insulating layer 214 to cover the surface of the conducting layer 104. Preferably, the step is executed by performing a global planarization process with CMP. The excessive insulating layer 214 is removed by etching with different polishing characteristics between the masking layer 106, the mask spacer 110, and the insulating layer 214. This exposes the masking layer 106 and the surface of the mask spacer 110, leaving the insulating layer 214 which covers the surface of the conducting layer 104.

Figure 2D:
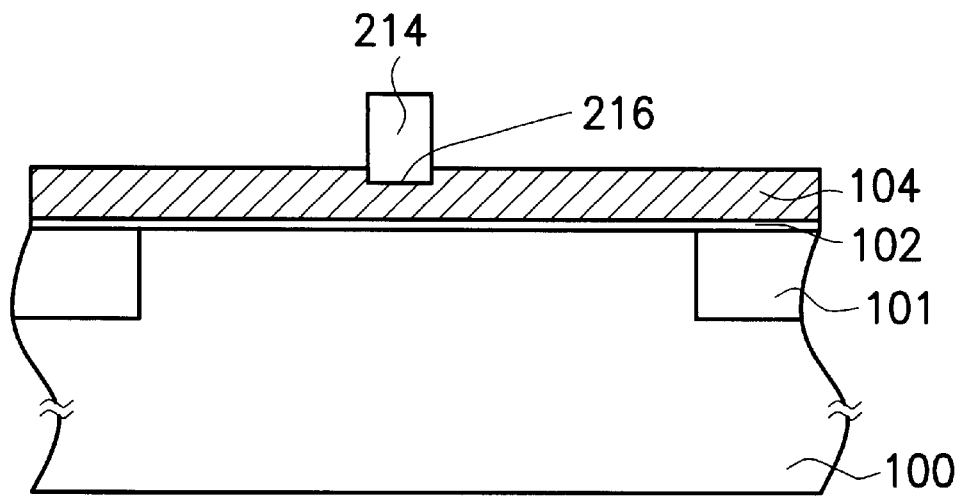

Referring to FIG. 2D, the masking layer 106 and the mask spacer 110 are removed, exposing the surface of the conducting layer 104. Preferably, the step is executed with a selective wet etching process, for example, with hot phosphoric acid treatment.

Figure 2E:
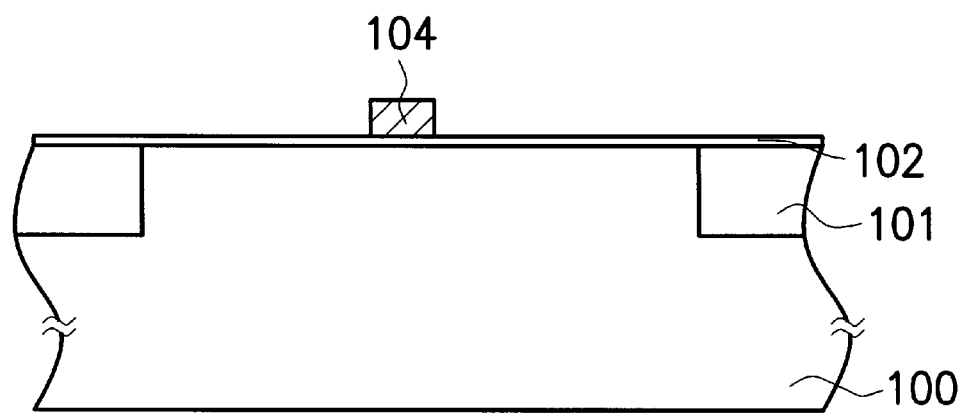

Referring to FIG. 2E, the conducting layer 104 excluding from the bottom 216 of the insulating layer 214 is removed, leaving the patterned conducting layer 104. Preferably, this is performed via an anisotropic dry etching process, with the insulating layer 214 serving as the etching mask. The insulating layer 214 is removed, in this case, by wet etching to expose the patterned conducting layer 104.

Figure 3A:
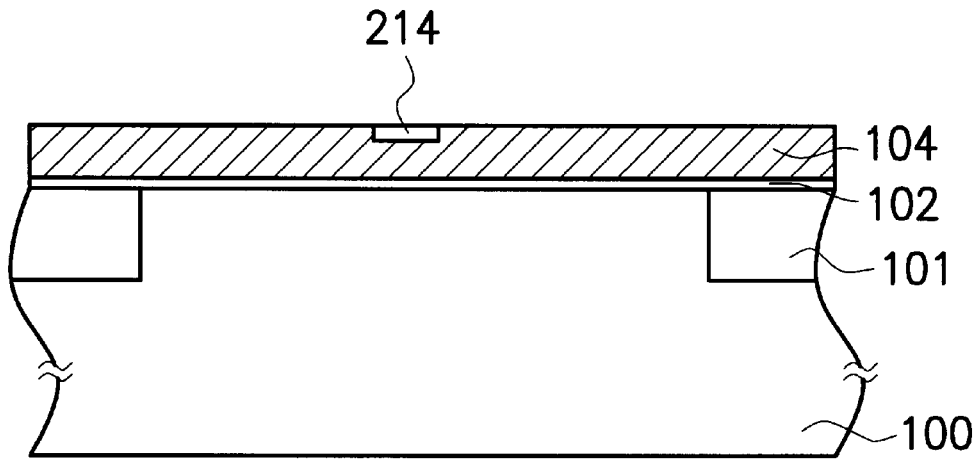
FIGS. 3A and 3B are cross-sectional diagrams showing the process flow of still another semiconductor device according to a preferred embodiment of the invention.
Figure 3B:
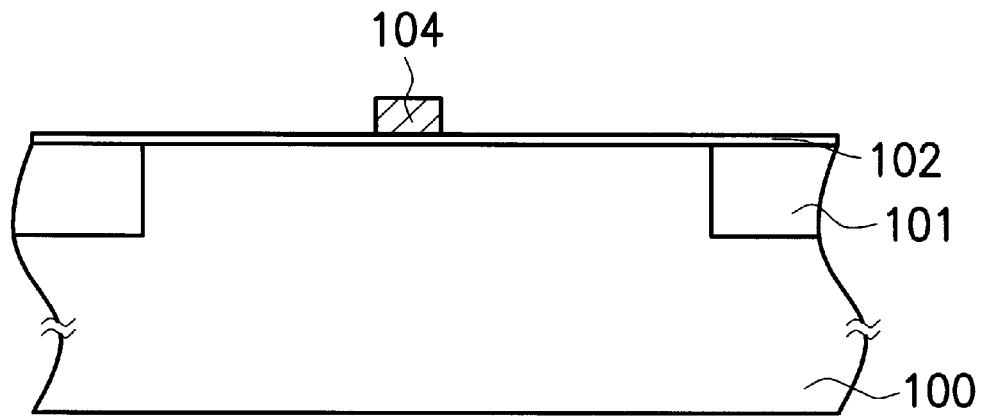

The above process can be further changed. As shown in the FIG. 2C, for example, after the masking layer 106 and the mask spacer 110 are exposed, a planarization process can be performed with CMP to continue polishing the insulating layer 214, the masking layer 106, and the mask spacer 110 until the mask spacer 110 and the masking layer 106 are removed. This leaves the insulating layer 214 in the conducting layer 104, as shown in FIG. 3A. The conducting layer 104 excluding from the bottom 216 of the insulating layer 214 is removed. After the insulating layer 214 is removed, the conducting layer 104 remains as shown in FIG. 3B.

Summarizing the above, the method in the invention can determine the size of the opening according to the current photolithographic process. The mask spacer formed on the sidewall of the opening can compensate for the deficiency in the photolithographic process, allowing the dimension to be reduced after the patterning of the material layer. Thus, the process of below 0.15 mm can be performed using a 248 nm deep ultra-violet (DUV) ray stepper or a 365 nm I-Line stepper in the invention, so that the difficulty encountered in the photolithographic process is reduced. In addition, the dimension of the material layer to be defined is reduced even when the machine is not replaced. Thus, the cost of the production is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a semiconductor device, comprising the steps of:

forming a material layer on a substrate;

forming a masking layer on the material layer, wherein the masking layer has an opening to expose the material layer;

forming a mask spacer on a sidewall of the opening;

filling an insulating layer in the opening to cover the material layer exposed by the opening and to cover at least a portion of the mask spacer;

removing the mask layer and the mask spacer;

removing the material layer uncovered by a bottom of the insulating layer; and removing the insulating layer.

2. The fabricating method of claim 1, wherein the insulating layer has different etching and polishing rates from those of the masking layer and the mask spacer.

3. The fabricating method of claim 1, wherein the method of forming the insulating layer in the opening further comprises: forming a blanket insulating material on the substrate; and performing a planarization process to remove the blanket insulating material located outside the opening.

4. The fabricating method of claim 3, wherein the planarization process includes chemical mechanical polishing (CMP).

5. The fabricating method of claim 1, wherein the step of removing the material layer uncovered by the insulating layer includes anisotropic etching.

6. The fabricating method of claim 1, wherein the step of removing the insulating layer includes wet etching.

7. The fabricating method of claim 1, wherein further comprises removing of a part of the material layer exposed by the opening to extend the opening to the material layer.

8. The fabricating method of claim 7, wherein the method of forming the insulating layer in the opening further comprises: forming a blanket insulating material on the substrate;

performing a planarization process to remove the blanket insulating material located outside the opening.

9. The fabricating method of claim 8, wherein the planarization process includes CMP.

10. The fabricating method of claim 9, further comprising removing of a part of the insulating layer by planarization with CMP after the masking layer and the mask spacer are removed.

11. The method of claim 1, wherein the mask layer is formed directly on the material layer.

12. A method of fabricating a semiconductor device, comprising the steps of:

forming a conductive layer on a substrate;

forming a masking layer on the conductive layer, the masking layer having an opening which exposes the conductive layer, wherein the opening has a first linewidth;

forming a mask spacer on a sidewall of the opening;

filling an insulating layer in the opening to cover the conductive layer exposed by the opening and to cover at least a portion of the mask spacer;

removing the masking layer and the mask spacer;

removing the conductive layer uncovered by a bottom of the insulating layer, so that a gate with a second linewidth which is smaller than the first linewidth is defined; and removing the insulating layer.

13. The fabricating method of the claim 12, wherein the insulating layer has different etching and polishing rates from those of the masking layer and the mask spacer.

14. The fabricating method of claim 12, further comprising a step before forming the insulating layer:

removing a part of the conductive layer exposed by the opening, so as to extend a depth of the opening.

15. The fabricating method of claim 12, wherein the first linewidth is 0.25 µm, and the second linewidth is 0.18 µm.

16. The fabricating method of claim 12, wherein the step of removing the conductive layer uncovered by the insulating layer includes anisotropic etching.

17. The fabricating method of claim 12, wherein the step of removing the insulating layer includes wet etching.

18. The fabricating method of claim 12, wherein the step of forming the insulating layer in the opening further comprises: forming a blanket insulating material on the substrate;

performing a planarization process to remove the blanket insulating material located outside the opening.

19. The fabricating method of claim 18, wherein the planarization process includes CMP.

20. The fabricating method of claim 19, further comprising planarization with CMP to remove a part of the insulating layer after the masking layer and the mask spacer are removed.

* * * * *